US009263535B2

(12) United States Patent
Colinge et al.

(10) Patent No.: US 9,263,535 B2
(45) Date of Patent: Feb. 16, 2016

(54) METHOD FOR FABRICATING A GATE ALL AROUND DEVICE

(71) Applicant: Taiwan Semiconductor Manufacturing Company, Ltd., Hsin-Chu (TW)

(72) Inventors: Jean-Pierre Colinge, Hsinchu (TW); Kuo-Cheng Ching, Zhubei (TW); Zhiqiang Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/468,511

(22) Filed: Aug. 26, 2014

(65) Prior Publication Data

US 2015/0048454 A1 Feb. 19, 2015

Related U.S. Application Data

(62) Division of application No. 13/725,536, filed on Dec. 21, 2012, now Pat. No. 8,815,691.

(51) Int. Cl.
*H01L 29/76* (2006.01)
*H01L 29/423* (2006.01)
*H01L 29/78* (2006.01)
*H01L 29/66* (2006.01)

(52) U.S. Cl.
CPC .... *H01L 29/42356* (2013.01); *H01L 29/42392* (2013.01); *H01L 29/66545* (2013.01); *H01L 29/66795* (2013.01); *H01L 29/785* (2013.01); *H01L 29/7841* (2013.01)

(58) Field of Classification Search
CPC ........... H01L 2224/16227; H01L 2224/81192; H01L 23/49827; H01L 24/03; H01L 24/81

USPC ................... 257/347, 401, E29.262, E29.264
See application file for complete search history.

(56) References Cited

U.S. PATENT DOCUMENTS

| 6,537,862 | B2 | 3/2003 | Song |
| 6,969,878 | B2 | 11/2005 | Coronel |
| 7,696,046 | B2 | 4/2010 | Kim |
| 7,910,467 | B2 | 3/2011 | Hsu |
| 2004/0016968 | A1 | 1/2004 | Coronel |
| 2014/0175561 | A1 | 6/2014 | Colinge |

FOREIGN PATENT DOCUMENTS

FR 2799305 6/2001

OTHER PUBLICATIONS

S. Monfra Y et al., "50nm—Gate All Around (GAA)—Silicon on Nothing (SON)—Devices: A Simple Way to Co-integration of GAA Transistors within bulk MOSFET process," 2002 Symposium on VLSI Technology Digest of Technical Papers, pp. 108-109/.

*Primary Examiner* — Andy Huynh
(74) *Attorney, Agent, or Firm* — Haynes and Boone, LLP

(57) ABSTRACT

The device includes a wafer substrate including an isolation feature, a fin base embedded in the isolation feature, at least one channel disposed above the fin base, and a gate stack disposed around the channel, wherein the gate stack includes a top portion and a bottom portion of the gate stack formed by filling a cavity around the channel such that the top portion and bottom portion are aligned each other. The device further includes at least one source and one drain disposed over the fin base, wherein the channel connects the source and the drain. The device further includes the source and the drain disposed over a fin insulator disposed over the fin base.

20 Claims, 21 Drawing Sheets

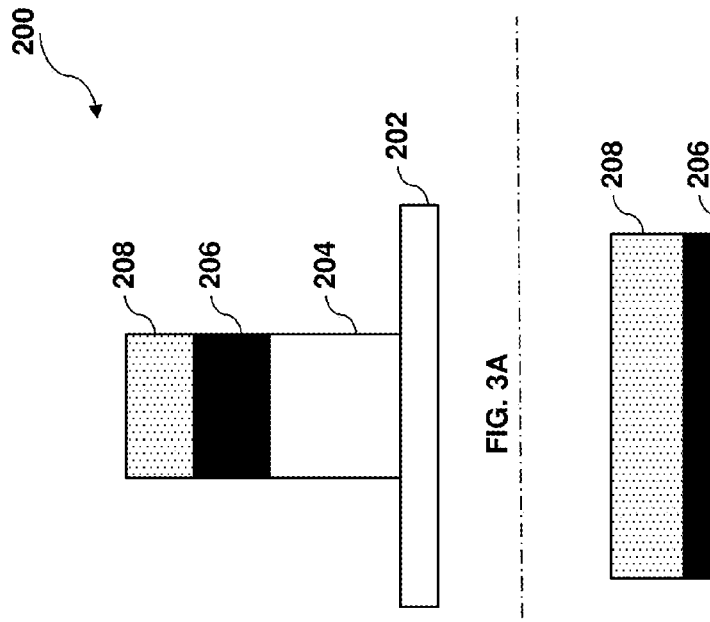
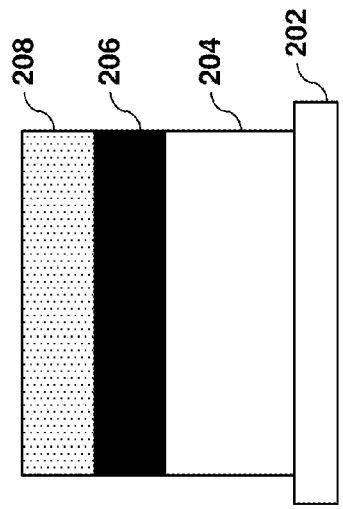
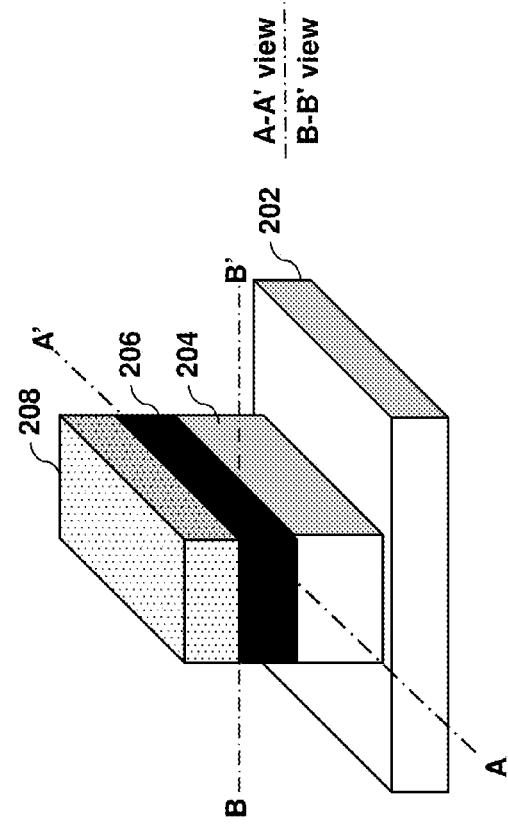
FIG. 3A
FIG. 3B
FIG. 2

A-A' view

B-B' view

A-A' view
B-B' view

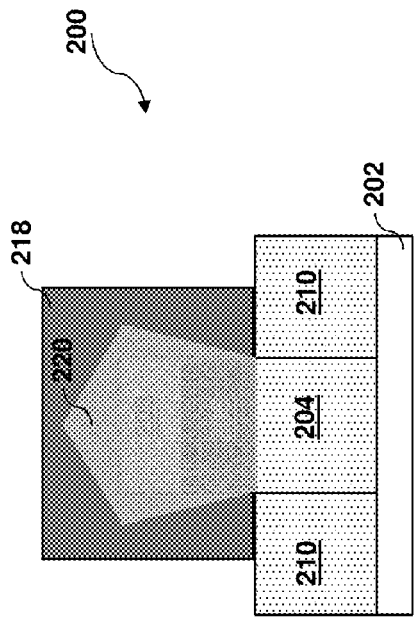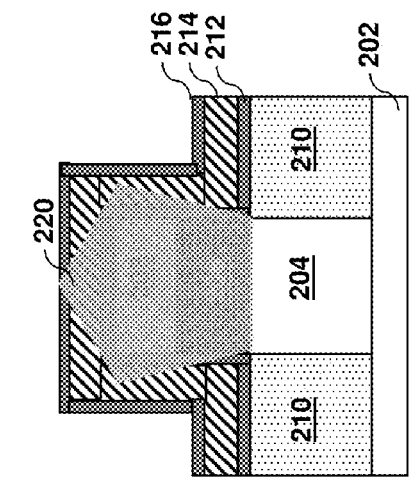
A-A' view
FIG. 6A
FIG. 7A
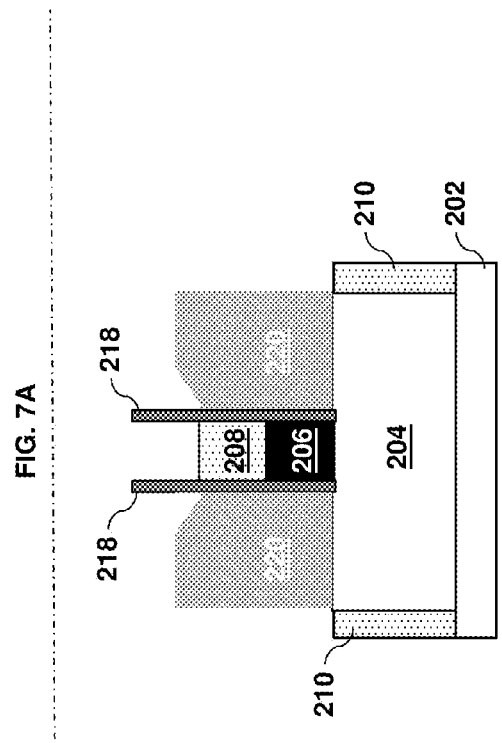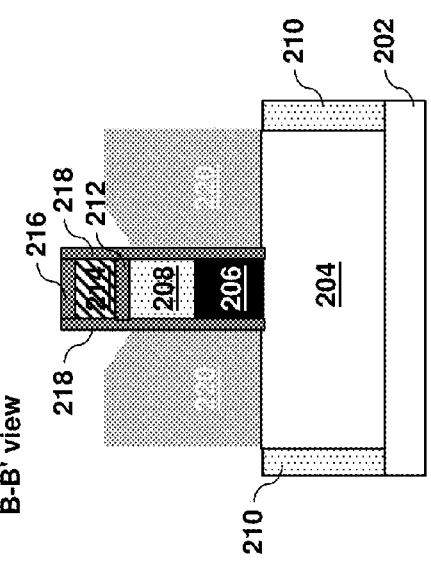
B-B' view
FIG. 6B
FIG. 7B

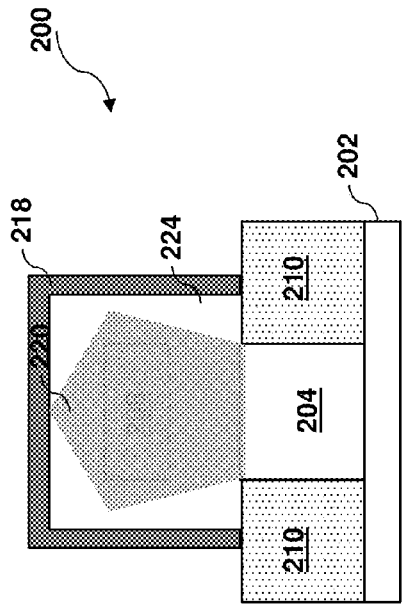
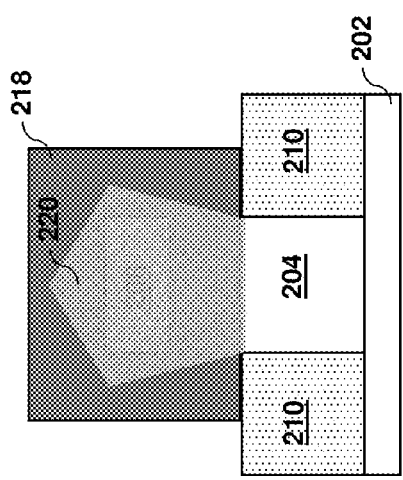
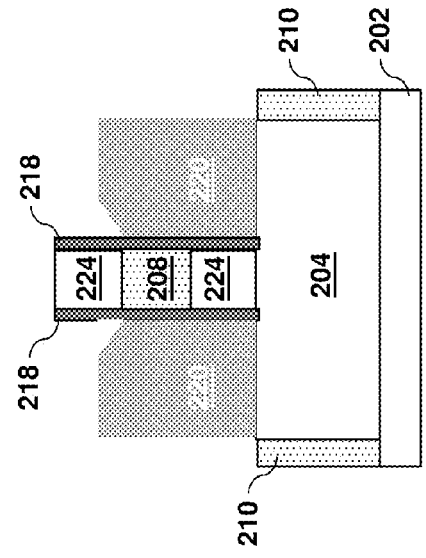
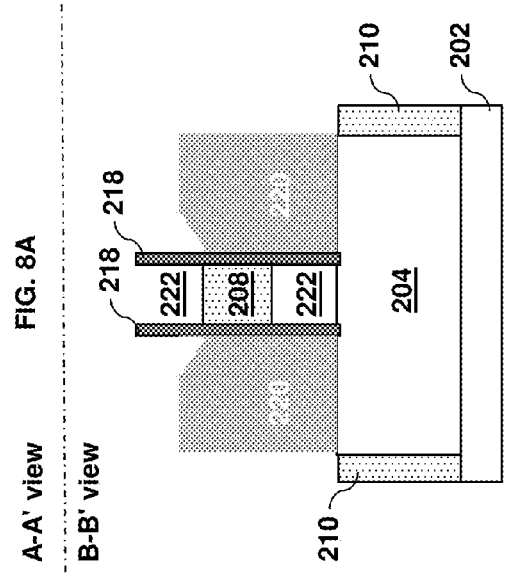
FIG. 8A    FIG. 9A
A-A' view
B-B' view
FIG. 8B    FIG. 9B

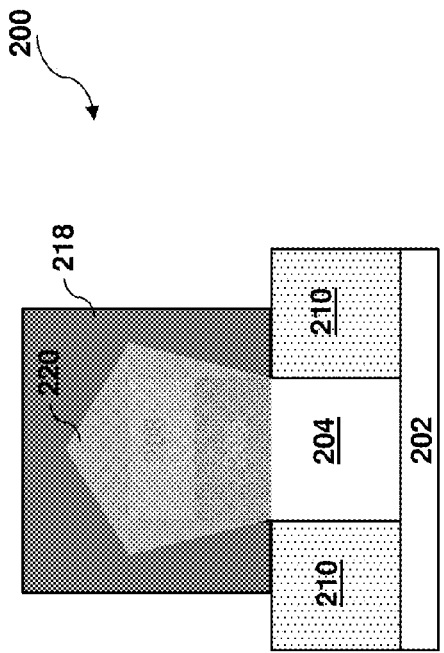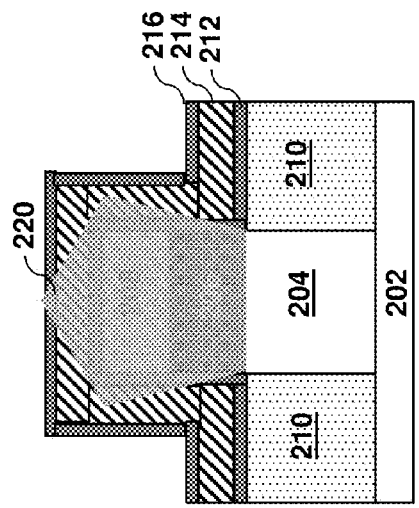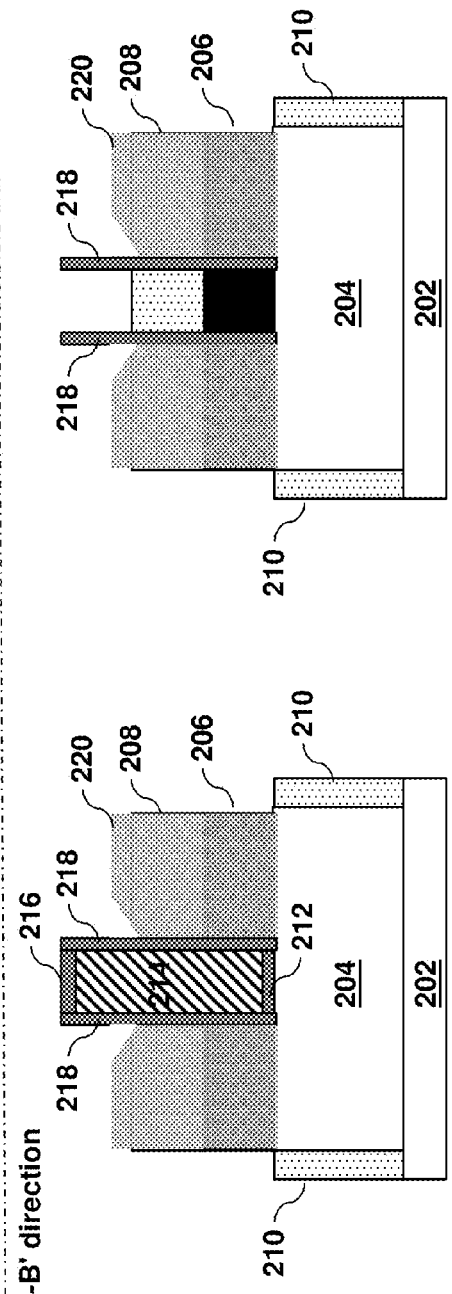
FIG. 11A
FIG. 12A
FIG. 11B
FIG. 12B
A-A' direction
B-B' direction

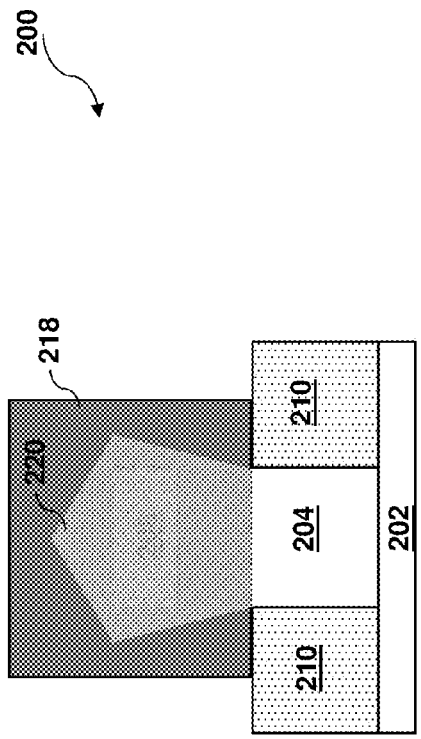
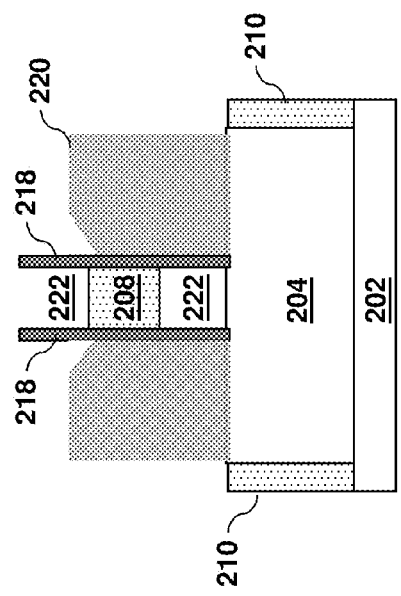
A-A' view
B-B' view
FIG. 13A
FIG. 13B

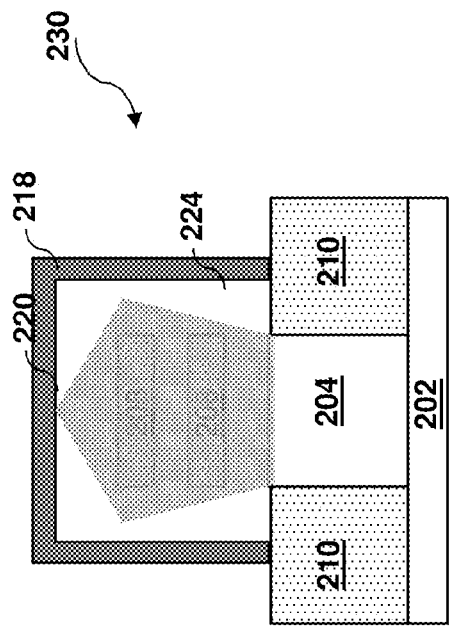
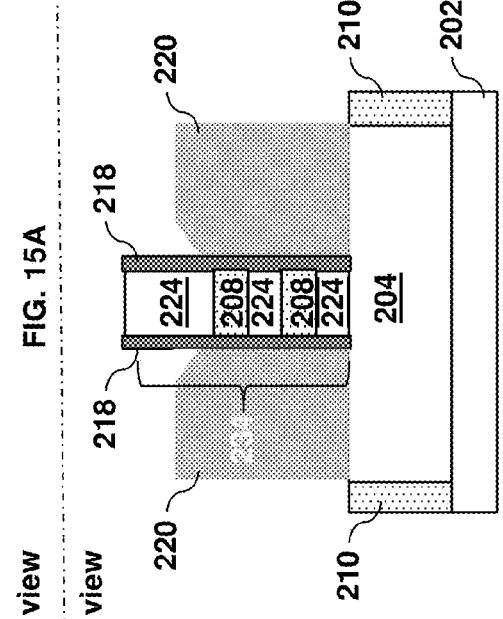
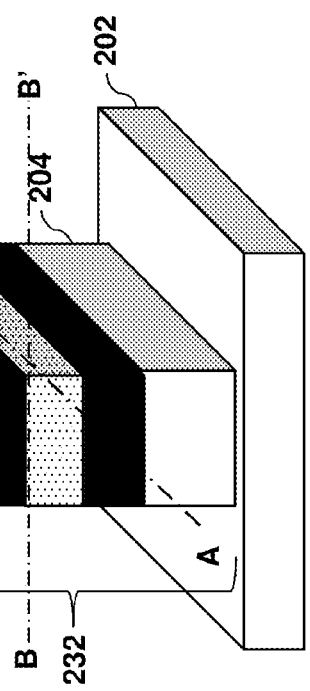
FIG. 15A
FIG. 15B
FIG. 14

A-A' view

B-B' view

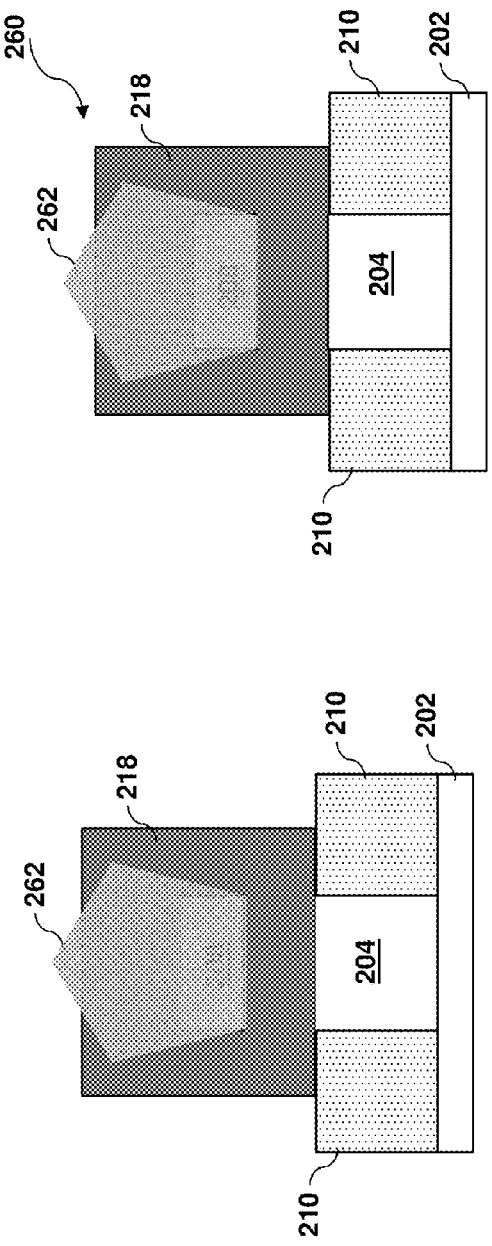
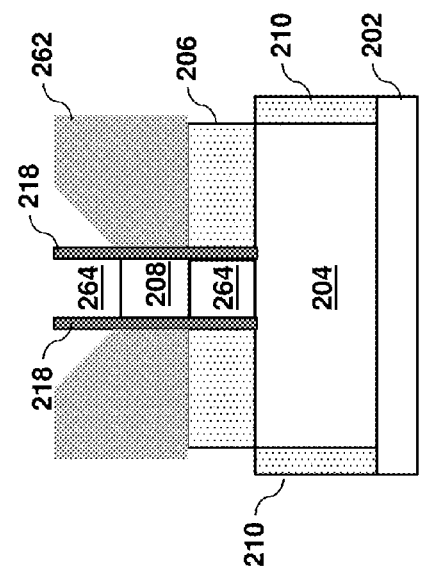
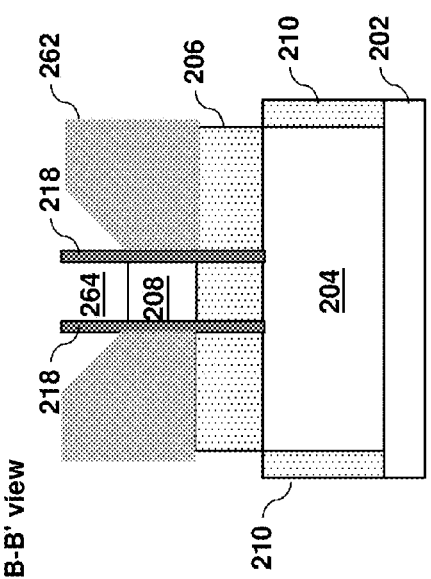
A-A' view
FIG. 19A
FIG. 20A
B-B' view
FIG. 19B
FIG. 20B

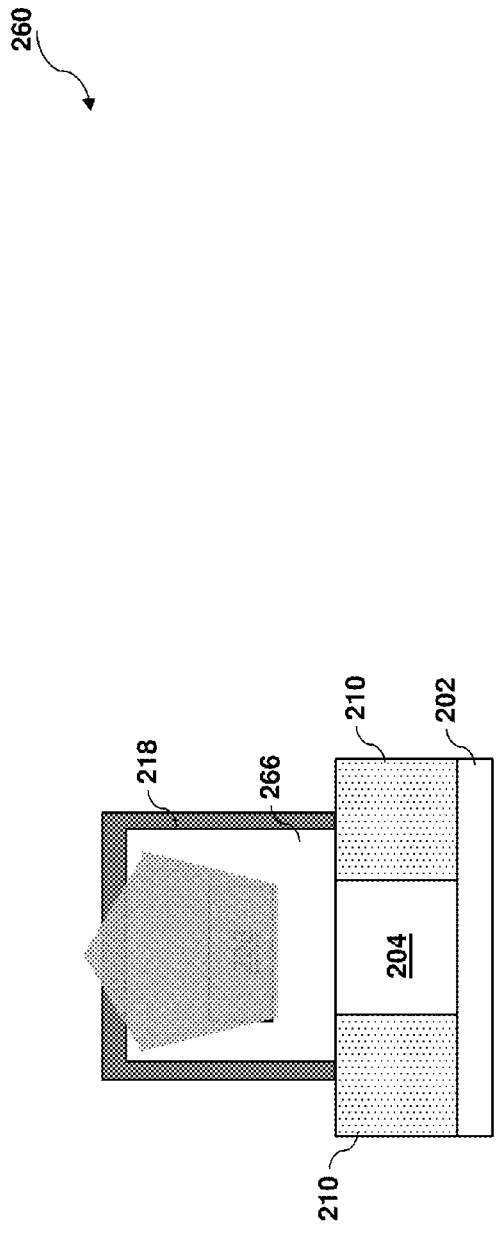
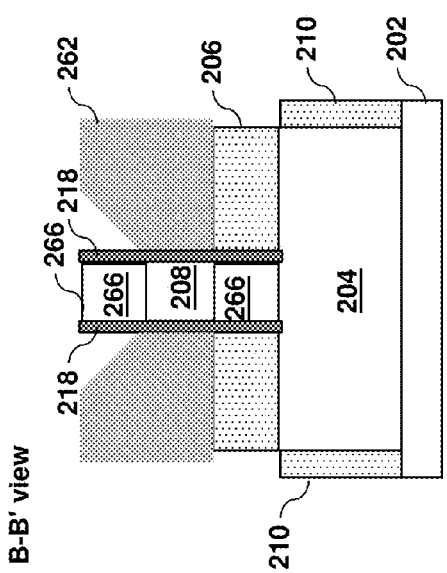
FIG. 21A
FIG. 21B

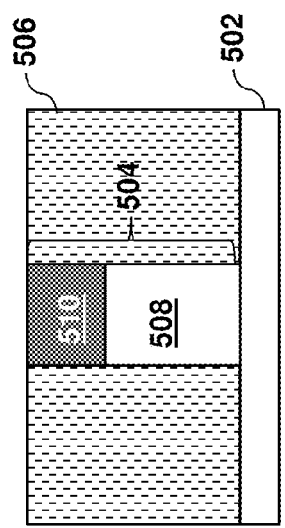
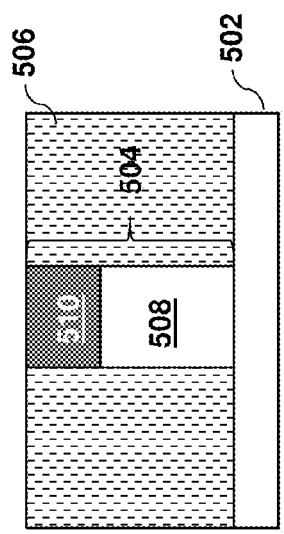
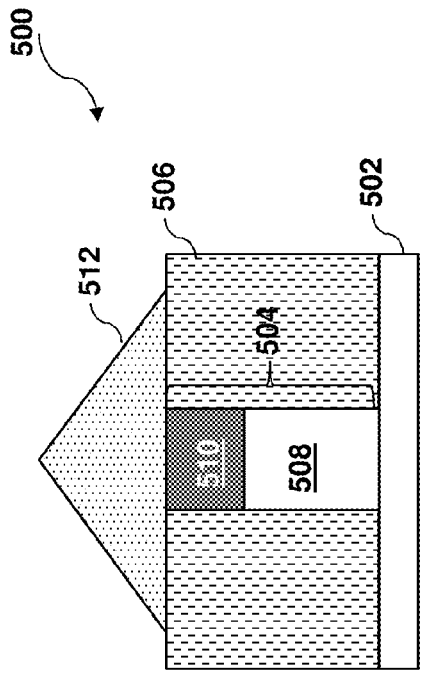
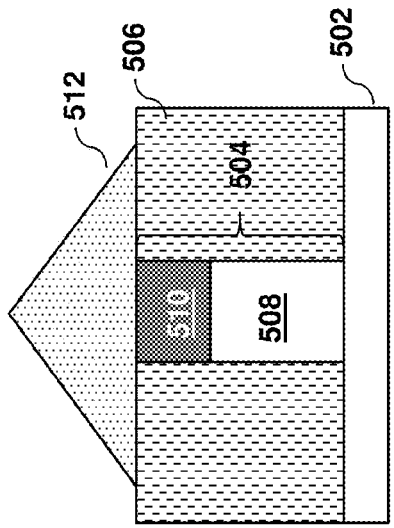
FIG. 23A
FIG. 23B
FIG. 24A
FIG. 24B
A-A' view
B-B' view

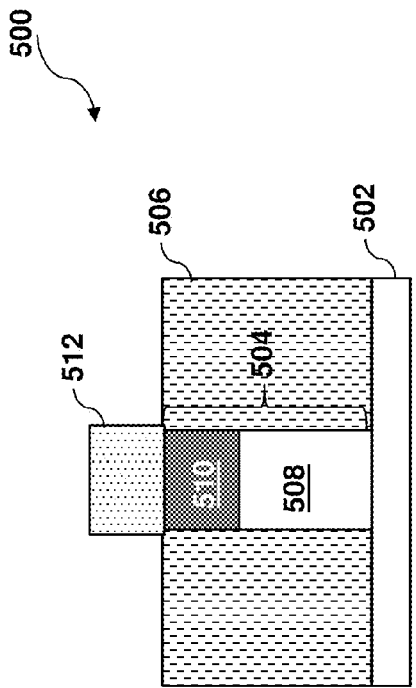
FIG. 25A A-A' view
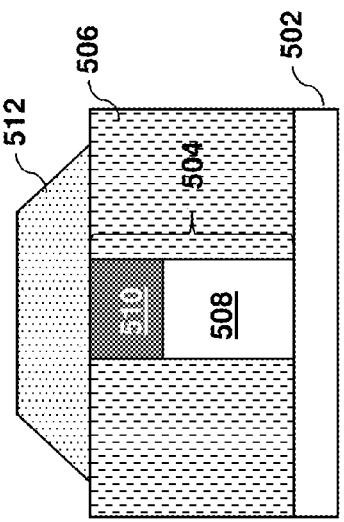
FIG. 26A
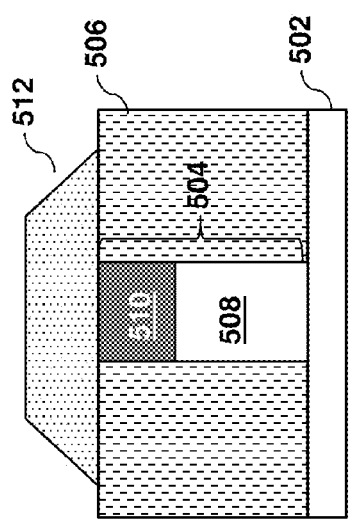
FIG. 25B B-B' view
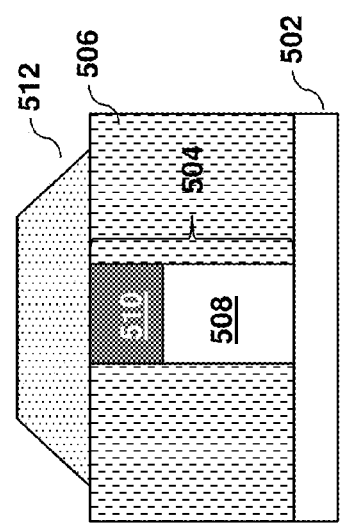
FIG. 26B

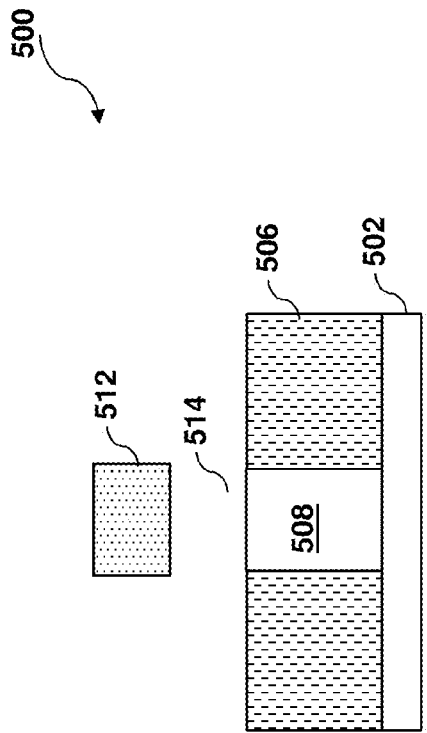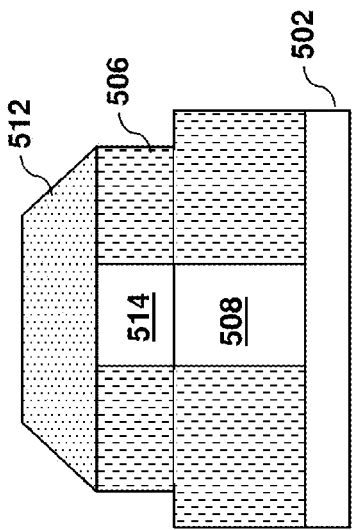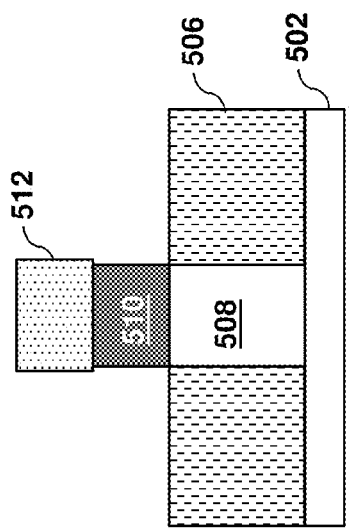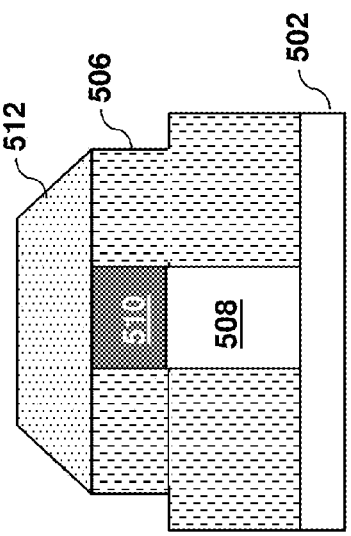
A-A' view    FIG. 27A        FIG. 28A
B-B' view    FIG. 27B        FIG. 28B

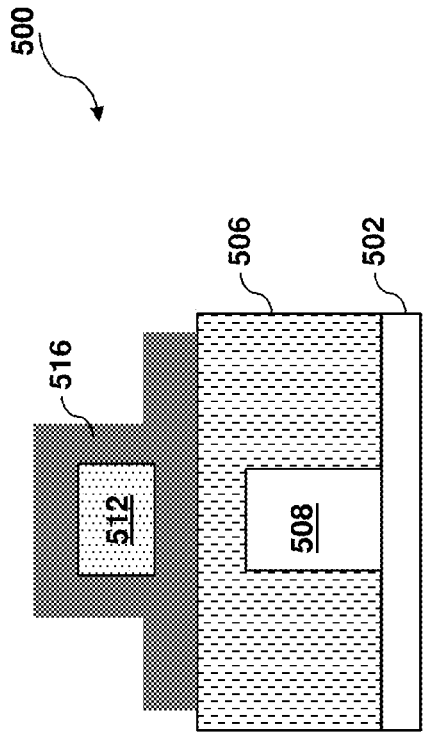
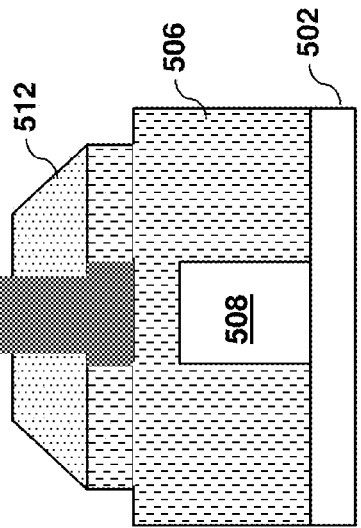
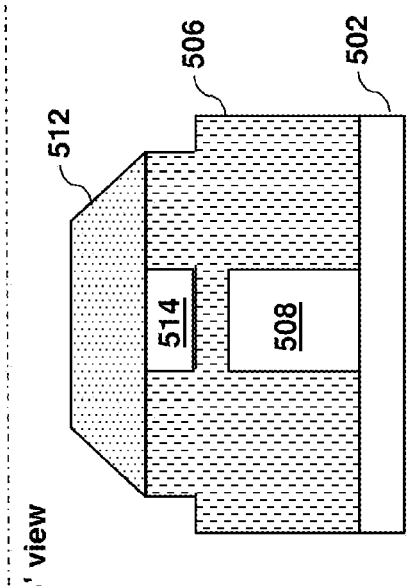
FIG. 29A
FIG. 30A
FIG. 29B
FIG. 30B
A-A' view
B-B' view

METHOD FOR FABRICATING A GATE ALL AROUND DEVICE

PRIORITY DATA

The present application is a divisional application of U.S. patent application Ser. No. 13/725,536, filed Dec. 21, 2012, which is incorporated herein by reference in its entirety

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One development in the scaling down process is the use of fin-type field effect transistors (FinFETs). It is desired to further improve the operation of FinFETs, such as by using a gate all around (GAA) transistor structure to increase the efficiency of gate control over the transistor channel. The GAA structure is typically formed on a silicon-on-nothing (SON) substrate, and is not self-aligned. This can result in a high source and drain resistance and further loss performance. Accordingly, what is needed is a device for improving the fabrication and operation of the FinFET.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2, 3A-B, 4A-C, 5A-B, 6A-B, 7A-B, 8A-B, 9A-B, 11A-B, 12A-B, 13A-B, 14, 15A-B, 17A-B, 18A-B, 19A-B, 20A-B, 21A-B, 23A-B, 24A-B, 25A-B, 26A-B, 27A-B, 28A-B, 29A-B, and 30A-B are cross sectional views of devices being fabricated according to one or more embodiments of the present disclosure.

DETAILED DESCRIPTION

Figure 1:
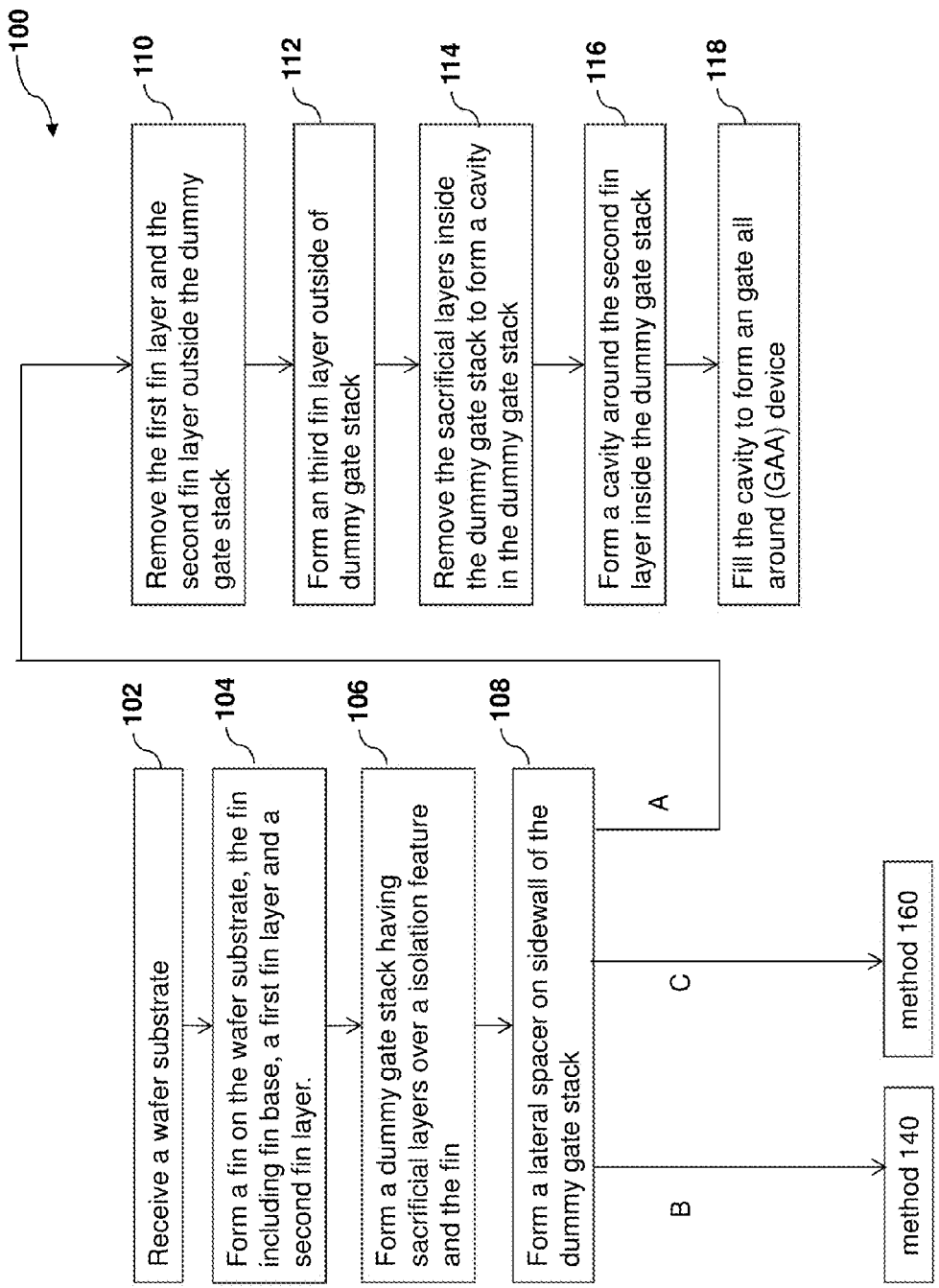
FIGS. 1, 16, 10, and 22 are flow charts of methods of fabricating a device according to one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

Referring now to FIG. 1, a flow chart of a method 100 of fabricating a device is illustrated according to one or more embodiments. FIGS. 2-9B, illustrate an example device 200 being fabricated using the method 100, it being understood that the method 100 is not limited to the device 200 as shown. For the sake of future reference, the view in FIG. 2 includes two cross sectional axes, A-A' and B-B.' The following figures with an "A" suffix are views from a cross section (cut plane) perpendicular to the A-A' axis, and the figures with a "B" suffix are views from a cross section (cut plane) perpendicular to the B-B' axis.

In the present embodiments, a device is also referred to as a structure or a transistor. It is understood that other configurations and inclusion or omission of various items in the device 200 may be possible.

The method 100 begins at step 102 by receiving a wafer substrate. In some embodiments, the wafer substrate includes a wafer and/or a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), and platinum (Pt) and, thereof an alloy of the metals and other conductive substances such as nitrides (e.g. titanium nitride (TiN), tantalum nitride (TaN) and carbides (e.g. titanium carbide (TiC), tantalum carbide (TaC). The insulator material may include silicon oxide and silicon nitride.

The method 100 proceeds to step 104 by forming a fin on the wafer substrate. The fin includes a fin base disposed on the wafer substrate, a first fin layer disposed on the fin base, and a second fin layer disposed on the first fin layer. The fins base and layers may be formed and/or shaped using one or more epitaxial growth and patterning processes (e.g., deposition, resist, exposure, develop, etch). In the present embodiment, the fin base is derived from the wafer substrate. The first fin layer has a significantly different etching rate compared to the fin base or the second fin layer. In some embodiments, the first fin layer may include an epitaxial (EPI) layer, such as SiGe. The first fin layer may include other suitable materials having a significantly different etching rate compared to the fin base or the second fin layer. The second fin layer may include an epitaxial (EPI) layer, such as Si. The second fin layer may include other suitable materials having a significantly different etching rate compared to the first fin layer.

With referring to the examples of FIGS. 2, 3A and 3B, a fin base 204 is disposed on a wafer substrate 202, a first fin layer 206 is disposed on the fin base 204, and a second fin layer 208 is disposed on the first fin layer 206. The fin base 204, the first fin layer 206, and the second fin layer 208 together form the fin.

The method 100 proceeds to step 106 by forming a dummy gate stack over an isolation feature, such as a shallow trench isolation (STI) disposed over the wafer substrate and over the fin disposed over the wafer substrate. In some embodiments, the fin base is embedded into the isolation feature by forming the isolation feature on the wafer substrate. In one embodiment, the isolation feature includes silicon oxide. The isolation feature may include other suitable materials. In some embodiments, the dummy gate stack includes a bottom sacrificial layer over the fin and the isolation feature, a middle sacrificial layer disposed on the bottom sacrificial layer, and a top sacrificial layer disposed on the middle sacrificial layer. In some embodiments, the top or bottom sacrificial layer includes silicon oxide, silicon nitride, silicon nitride-oxide, or other high-k dielectric materials, and the middle sacrificial layer includes polysilicon. The sacrificial layers may include other suitable materials.

In the present embodiment, step 106 includes depositing the bottom sacrificial layer over the fin and the isolation feature, depositing the middle sacrificial layer over the bottom sacrificial layer and depositing the top sacrificial layer over the middle sacrificial layer. The deposition process can be a chemical vapor deposition (CVD), low-pressure chemical vapor deposition (LPCVD), a plasma-enhanced chemical vapor deposition (PECVD), or an atomic layer deposition (ALD) process. Step 106 also includes using a lithography process. Step 106 further includes using an etching process. With reference to the examples of FIGS. 4A and 4B, an isolation feature 210 such as a shallow trench isolation (STI) disposed on the wafer substrate 202 to embed the fin base 204, a bottom ILD layer 212 is disposed around the fin (including the first fin layer 206 and the second fin layer 208), a middle sacrificial layer 214 is disposed over the bottom sacrificial layer 212, and a top sacrificial layer 216 is disposed over the middle sacrificial layer 214.

The method 100 proceeds to step 108 by forming a lateral spacer on sidewalls of the dummy gate stack. In some embodiments, the lateral spacer includes silicon oxide, silicon nitride, silicon oxynitride, or other dielectric materials. Step 108 also begins another route or method to fabricate the device 200, which will be discussed in more detail below. Step 108 includes using a deposition process. With reference to the example of FIG. 4C, a lateral spacer 218 is disposed on the sidewall of the dummy gate stack including the bottom sacrificial layer 212, the middle sacrificial layer 214, and the bottom sacrificial layer 216. The spacer can be formed by deposition of the spacer material followed by an anisotropic etch step.

Figure 16:
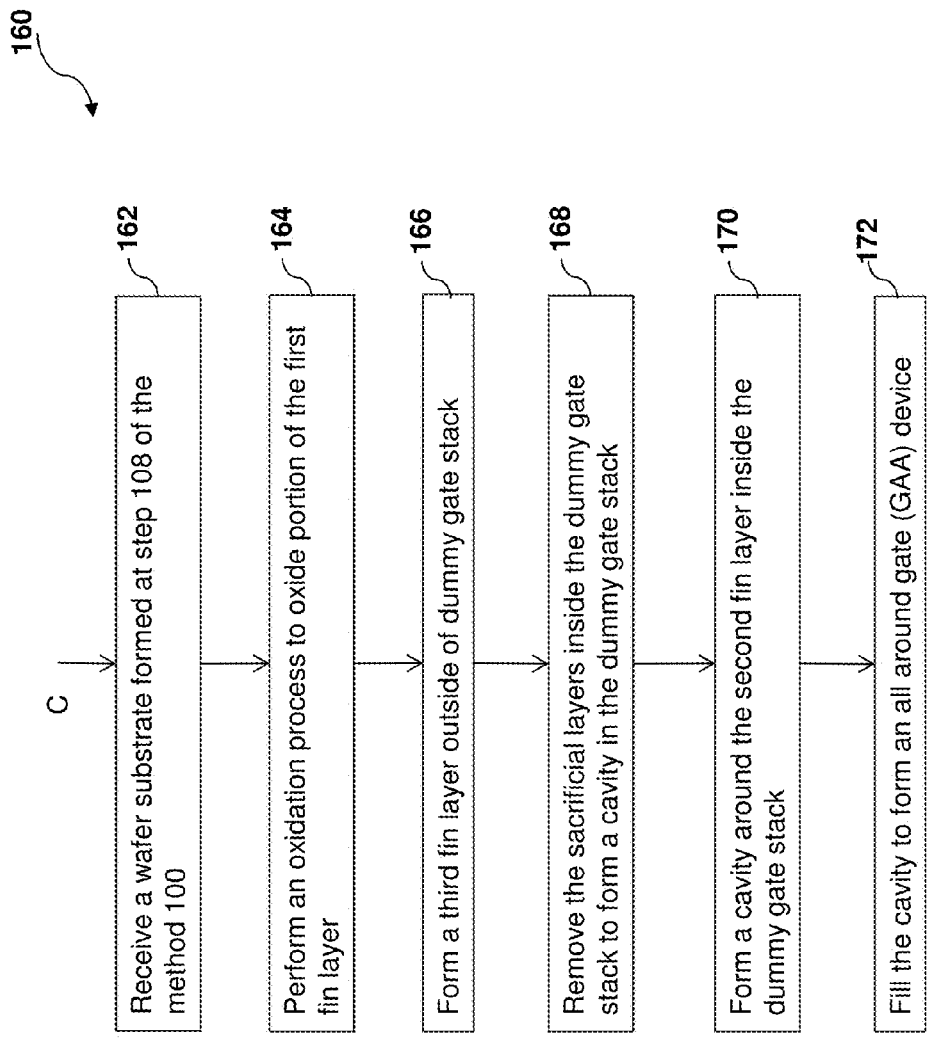
Figure 17A:
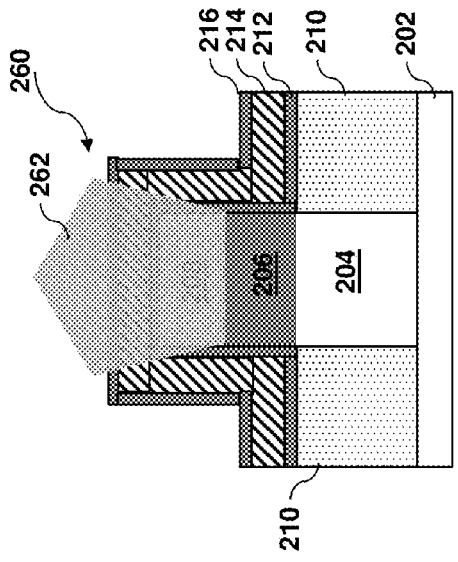
Figure 17B:
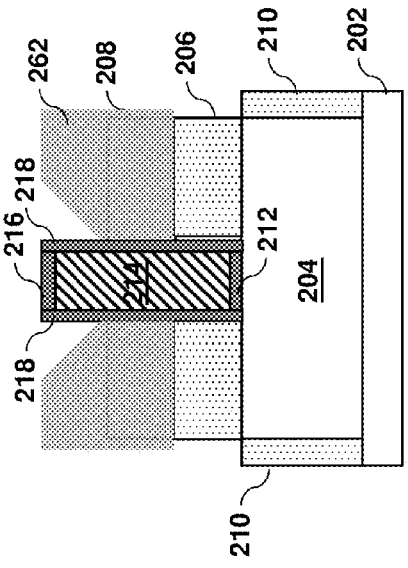
Figure 18A:
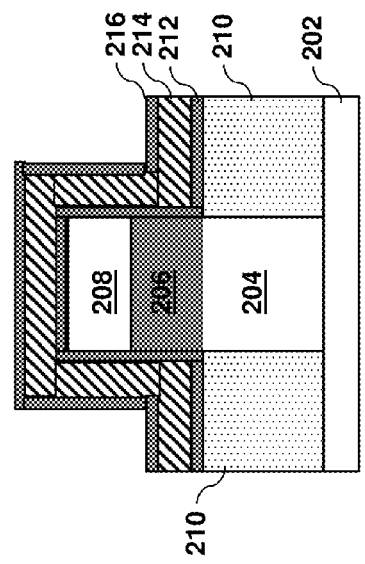
Figure 18B:
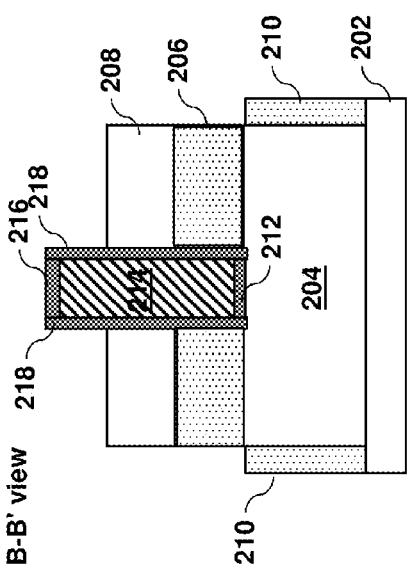

After step 8, the method 100 can continue in three different options, labeled as A, B, and C, in FIG. 1. The present discussion will continue with option A, and execution proceeds to step 110. Options B and C are discussed below with reference to FIGS. 10 and 16, respectively.

The method 100 proceeds to step 110 by removing the first fin layer and the second fin layer outside the dummy gate stack. The first fin layer and the second fin layer only remain inside the dummy gate stack. Step 110 includes using an etching process and a cleaning process. With reference to the examples of FIGS. 5A and 5B, the first fin layer 206 and the second layer 208 only remain inside the dummy gate stack.

The method 100 proceeds to step 112 by growing a third fin layer around the dummy gate stack. The third layer contacts first fin layer and second fin layer inside the dummy gate stack. The third fin layer is used as a source and drain of a transistor. The third fin layer has a significantly different etching rate compared to the first fin layer. In some embodiments, the third fin layer is formed by growing an EPI layer. The EPI layer may include Si EPI or other suitable material. With reference to the examples of FIGS. 6A and 6B, a third fin layer 220 is disposed over fin base 204 embedded in the isolation feature 210 disposed on the wafer substrate 202 and is sandwiched the first fin layer 206 and the second fin layer 208.

The method 100 proceeds to step 114 by removing the top sacrificial layer, the middle sacrificial layer and the bottom sacrificial layer inside the dummy gate stack to expose the first fin layer buried by the dummy gate stack. Step 114 includes using an etching process, such as a dry etching or a wet etching process. Step 114 also includes using a cleaning process. With reference to the examples of FIGS. 7A and 7B, the top sacrificial layer 216, the middle sacrificial layer 214, and the bottom sacrificial layer 212 are removed.

The method proceeds to step 116 by removing the first fin layer inside the dummy gate to form a cavity around the second fin layer inside the dummy gate. In the present embodiments, step 116 takes advantage of a significantly different etching rate of the first fin layer compared to the second fin layer or the third fin layer by using an etching process. The etching process removes the first fin layer and stops at the second fin layer or the third fin layer to form the cavity around the second fin layer inside the dummy gate stack. In some embodiments, the second fin layer remains and forms a channel (or a bridge channel) connecting the third fin layer (source and drain), such as an EPI layer. Step 116 includes using an etching process and a cleaning process. With reference to the examples of FIGS. 8A and 8B, a cavity 222 is formed around the second fin layer 208, the third fin layer 220 is disposed over the wafer substrate 202 and the fin base 204, and the second fin layer 208 serves as a channel connecting the third fin layer 220.

The method 100 proceeds to step 118 by forming a gate stack around the second fin layer (bridge channel) to form a gate all around (GAA) device (transistor) by filling the cavity around the second fin layer. In some embodiments, the gate stack includes an interfacial (ILD) layer, a high-k dielectric layer and a gate layer. The ILD layer includes silicon oxide, silicon nitride, or silicon nitride-oxide. The high-k layer includes a material or compound having a high dielectric constant. The gate layer includes polysilicon or metal. Step 118 includes using a deposition process, such as a CVD, a PECVD, an ALD, or an electro-plating process. Step 118 also includes using an etching process and a cleaning process. With reference to the examples of FIGS. 9A-B, a gate stack 224 is disposed around the second fin layer 208 and between lateral spacer 218. It is understood that additional steps can be provided before, during, and after the method 100, and some the steps described can be replaced, eliminated, or moved around for additional embodiments of the method 100.

In some embodiments as shown in FIGS. 9A-B, the gate stack 224 is formed by filling up a cavity around the second fin layer 208 between the lateral spacers 218. Therefore, the "bottom" gate and the "top" gate the gate stack are self-aligned with each other, and a width of the "bottom" gate and "top" gate as well as the side gate of the gate stack is uniformly distributed around the fin layer 208 (channel). The self-aligned gate stack around the channel minimizes resistance between a source and a drain and parasitic gate capacitance. The method 100 can also be used to fabricate a multiple channel GAA device to be discussed in more detail below.

Figure 4A:
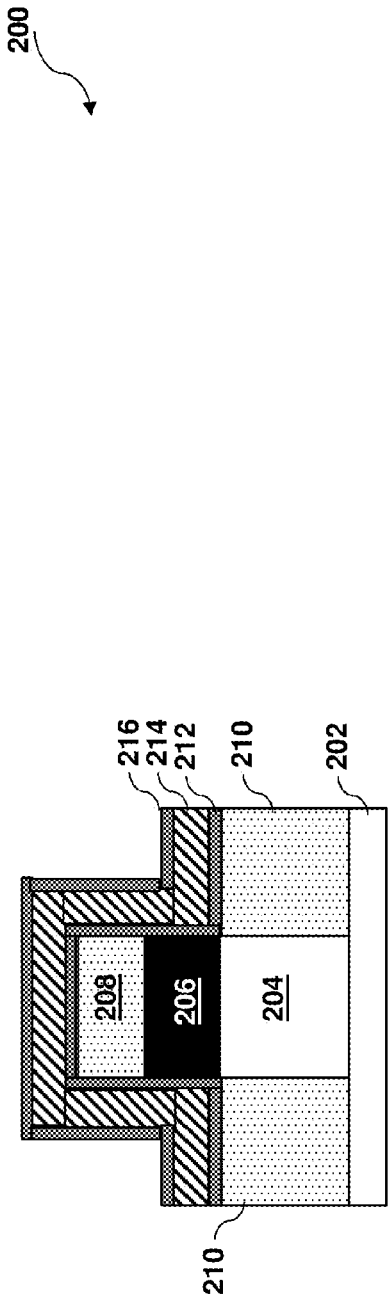
Figure 4C:
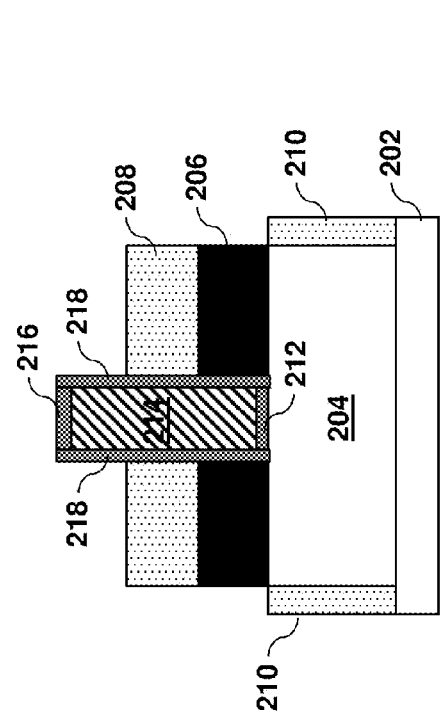
Figure 4B:
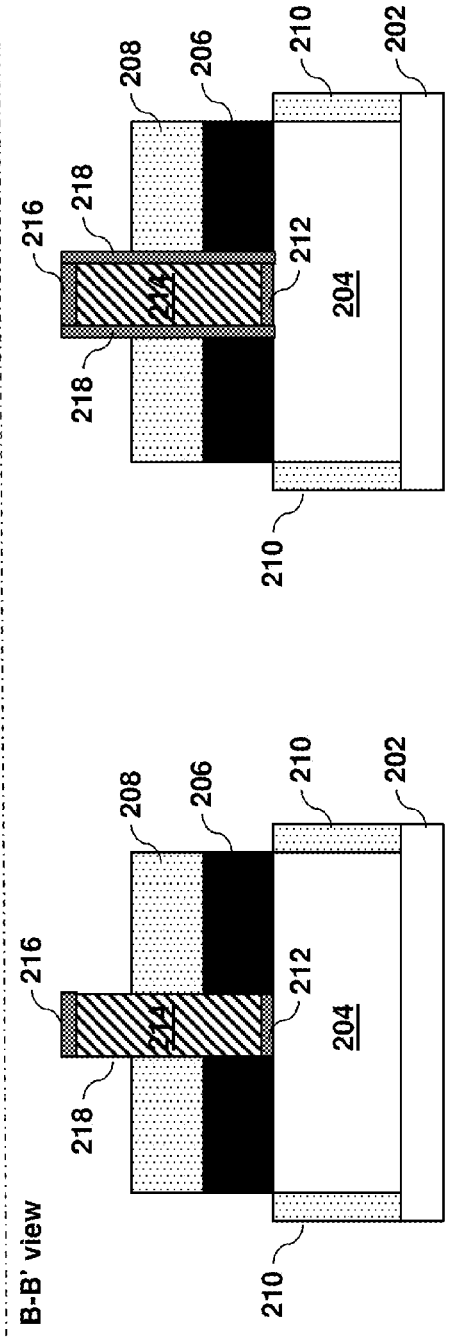
Figure 5A:
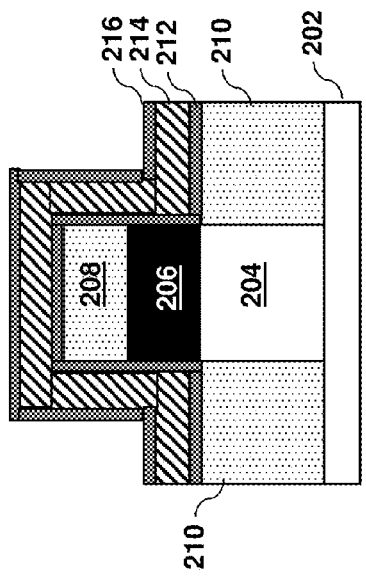
Figure 5B:
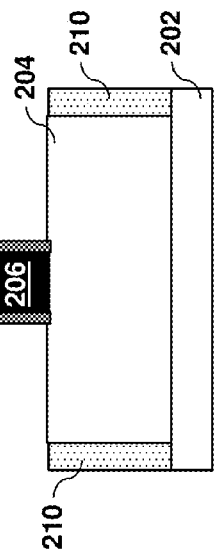

As discussed above, the method 100 can proceed with various options after step 108. Option B will now be described, with reference to FIG. 10. FIGS. 11A-13B, are exemplary diagrams or cross sectional views of fabricating the device 200 using the method 140 for implementing one or more embodiments. The method 140 is an alternative method of fabricating the device 200. The method 140 begins at step 142 by receiving a substrate formed at step 108 of the method 100. Step 302 receives a substrate with a fin disposed on an isolation feature disposed over a wafer substrate and a dummy gate stack disposed over the fin as shown in FIGS. 4A-C. With reference back to example of FIGS. 4A-C, the isolation feature 210 is disposed on the wafer substrate 202, the fin base 204 is embedded in the isolation feature 210, the first fin layer 206 is disposed over the bin base 204, the second fin layer 208 is disposed over the first fin layer 206, the bottom sacrificial layer 212 is disposed around the fin (including the first fin layer 206 and the second fin layer 208), the middle sacrificial layer 214 is disposed over the bottom sacrificial layer 212, the top sacrificial layer 216 is disposed over the middle sacrificial layer 214, and the lateral spacer 218 is disposed on the sidewall of the middle sacrificial layer 214.

The method 140 proceeds to step 144 by growing a third fin layer, for example, an EPI layer, around the fin and the dummy gate stack. In some embodiments, The EPI layer includes Si, SiGe or other suitable material as long as the third fin layer has a significant different etching rate compared to the first fin layer. The third fin layer may form a source and drain connected by the second fin layer. Step 144 may include using an EPI growth process. With reference to the examples of FIGS. 11A and 11B, the third fin layer 220 is disposed over the fin (including the first fin layer 206 and the second layer 208) and the dummy gate stack (including the bottom sacrificial layer 212, the middle sacrificial layer 214, the top sacrificial layer 214) and the lateral spacer 218 formed on the sidewall of the dummy gate stack.

The method 140 proceeds to step 146 by removing the top sacrificial layer, the middle sacrificial layer and the bottom sacrificial layer inside the dummy gate stack. Step 146 includes using an etching process, such as a dry etching or a wet etching process. Step 146 also includes using a cleaning process. With reference to FIGS. 12A and 12B, the top sacrificial layer 216, the middle sacrificial layer 214, and the bottom sacrificial layer 212 between the lateral spacer 218 are removed.

The method 140 proceeds to step 148 by removing the first fin layer between the fin base and the second fin layer by taking advantage of a substantial different etching rate between the first fin layer and the second fin layer to form a cavity around the second fin layer. Step 148 includes using an etching process. In one example, step 148 includes using a lateral anisotropic etching of the first fin layer, such as SiGe. In this example, the etching process removes the first fin layer and stops etching at the second fin layer or the third fin layer to form the cavity around the second fin layer inside the dummy gate stack. The second fin layer remains and forms a bridge channel (or a channel) connecting the third fin layer (source and drain), such as an EPI layer. In one embodiment, the SiGe may not totally removed by an etching process and remained residual can be easily replaced by SiGe oxide by an oxidation of the SiGe. In another example, step 148 includes using a wet anisotropic or isotropic etching process. With reference to the examples of FIGS. 13A and 13B, the cavity 222 is formed around the second fin layer 208, the third fin layer 220 is disposed over the wafer substrate 202 and the fin base 204, and the second fin layer 208 serves as a channel (or a bridge channel) connecting the third fin layer 220.

The method 140 proceeds to step 150 by forming a gate stack around the second fin layer (bridge channel) to form a gate all around (GAA) device or transistor by filling the cavity around the second fin layer. In some embodiments, the gate stack includes an ILD layer, a high-k dielectric layer and a gate layer. The ILD layer includes silicon oxide, silicon nitride, or silicon nitride-oxide. The high-k layer includes a material or compound having a high dielectric constant. The gate layer includes a polysilicon, a metal, or a metal alloy. Step 150 includes using a deposition process, such as a CVD, a PECVD, an ALD, or an electro-plating process. Step 150 also includes using an etching process. Step 118 also includes using a cleaning process. With reference to the examples of FIGS. 9A-B, a gate stack 224 is disposed around the second fin layer 208 and between lateral spacer 218. It is understood that additional steps can be provided before, during, and after the method 140, and some the steps described can be replaced, eliminated, or moved around for additional embodiments of the method 140. The method 140 is example embodiments, and is not intended to limit the present invention beyond what is explicitly recited in the claims.

In some embodiments, the method 100 or 140 can be used to fabricate a multiple channel GAA transistor or device by growing multiple pairs of alternative first fin layer and second fin layer on a wafer substrate. In the present embodiments, a multiple channel GAA transistor is also referred to as a multiple stacked GAA transistor. With reference to the example of FIG. 14, a fin 232 is formed over the wafer substrate 202 using the method 100. The fin 232 includes the fin base 204 disposed on the wafer substrate 202, the first fin layer 206 disposed over the fin base 204, the second fin layer 208 disposed over the first fin layer 206, the first fin layer 206 disposed over the second fin layer 208, and the second fin layer 208 disposed over the second fin layer 206.

Figure 10:
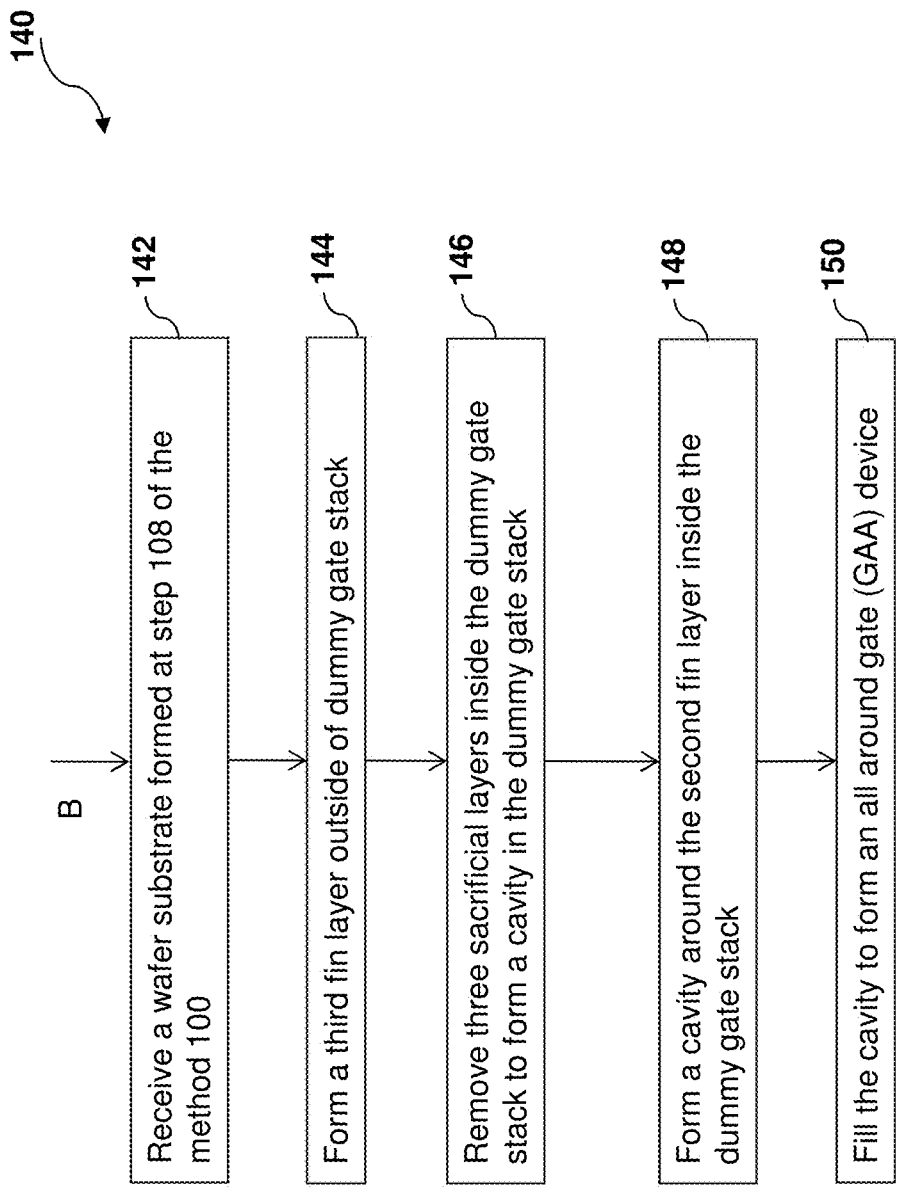

Continuing with the present embodiments, a multiple channel GAA transistor is fabricated based on a fin having a multiple pair of alternative first fin layer and second fin layer by using the method 100 shown in FIG. 1 or the method 140 shown in FIG. 10. With reference to the examples of FIGS. 15A and 15B, a double channel (stacked) GAA transistor 230 is illustrated. The double tacked GAA transistor 230 includes a double stacked gate 234 disposed over the fin base 204 embedded in the isolation feature 210 disposed over the wafer substrate 202 and embedded into the third fin layer 220. The double channel gate 234 include the gate stack 224 and two second fin layers 208 separated by the gate stack 224 between the lateral spacers 218. In the present embodiments, the two second fin layers 208 forms a first channel over the fin base 204 and a second channel over the first channel. The first change and the second channel are also self-aligned each other because the fin 232 as shown in FIG. 14 is formed at the same time. The third fin layer 220 is connected by the second fin layer 208. The second fin layer 220 is used as a channel connecting the third fin layer 220. In some embodiments, the third layer 220 includes a source and a drain. It is understood that other configurations and inclusion or omission of various items in the device 230 may be possible. The device 230 is example embodiments, and is not intended to limit the present invention beyond what is explicitly recited in the claims.

As shown in FIGS. 15A and 15B, the gate stack 222 is formed above and below the second fin layer 208 located between the two lateral spacers 218 at the same time. The gate stack 224 includes a top portion and a bottom portion around the second fin layer 208 (first change or second channel). The top portion and the bottom portion of the gate stack 224 around the second fin layer 208 are formed at the same time, therefore the gate stack 224 are self-aligned. In one embodiment, dimension of the top portion is equal to dimension of the bottom portion.

As discussed above, the method 100 (FIG. 1) can proceed with various options after step 108. Option C will now be described, with reference to FIG. 16. FIGS. 17A-21B are exemplary diagrams or cross sectional views of fabricating a device 260 using the method 160. The method 160 begins at step 162 by receiving a substrate formed at step 108 of the method 100 as shown in FIG. 1. Step 162 receives a substrate with a fin disposed on an isolation feature disposed over a wafer substrate and a dummy gate stack disposed over the fin as shown in FIGS. 4A-C. With reference back to example of FIGS. 4A-C, the isolation feature 210 is disposed on the wafer substrate 202, the fin base 204 is embedded in the isolation feature 210, the first fin layer 206 is disposed over the bin base 204, the second fin layer 208 is disposed over the first fin layer 206, the bottom sacrificial layer 212 is disposed around the fin (including the first fin layer 206 and the second fin layer 208), the middle sacrificial layer 214 is disposed over the bottom sacrificial layer 212, the top sacrificial layer 216 is disposed over the middle sacrificial layer 214, and the lateral spacer 218 is disposed on the sidewall of the middle sacrificial layer 214.

The method 160 proceeds to step 164 by performing an oxidation process. Performing the oxidation process includes oxidizing a portion of the first fin layer outside the dummy gate stack to form an oxide compound. The oxidized portion of the first fin layer becomes an insulator. In some embodiments, the insulator is used to fabricate a silicon on insulator (SOI) device. The oxidized portion of the first fin layer has a substantial different etching rate compared to an un-oxidized portion of the first fin layer inside the dummy gate stack. In one embodiment, the first fin layer includes SiGe and the portion of the first fin layer outside dummy gate stack becomes SiGeOx after the oxidation process. The SiGe has a different etching rate compared to the SiGeOx. Step 164 includes using an oxidation process, such as an $O_2$ implantation process. With reference to the FIGS. 17A and 17B, a portion (shadow portion) of the first fin layer 206 outside the dummy gate stack is oxidized.

The method 160 proceeds to step 166 by growing a third fin layer over the first fin layer, for example, an EPI layer, around the fin and the dummy gate stack. In some embodiments, the EPI layer includes Si, SiGe or other suitable material as long as the third fin layer has a significantly different etching rate compared to the first fin layer. The third fin layer may form a source and drain connected by the second fin layer. In some embodiments, because a portion of the first fin layer is oxidized and becomes an insulator, a quasi-SOI source and drain is formed. Step 166 may include using an EPI growth process. With reference to the examples of FIGS. 18A and 18B, a third fin layer 262 is disposed over the fin (including the first fin layer 206 and the second fin layer 208) and the dummy gate stack (including the bottom ILD layer 212, the sacrificial layer 214, the top ILD layer 214, and the lateral spacer 218).

The method 160 proceeds to step 168 by removing the top sacrificial layer, the middle sacrificial layer and the bottom sacrificial layer inside the dummy gate stack. Step 168 includes using an etching process, such as a dry etching or a wet etching process. Step 168 also includes using a cleaning process. With reference to FIGS. 19A and 19B, the top sacrificial layer 216, the middle sacrificial layer 214, the bottom sacrificial layer 212 between the lateral spacer 218 are removed, and a top portion of a cavity 264 above the second fin layer 208 is formed.

The method 160 proceeds to step 170 by removing un-oxidized portion of the first fin layer between the fin base and the second fin layer by taking advantage of a significantly different etching rate compared to the fin base, the second fin layer, or the oxidized portion of the first fin layer, to form a cavity around the second fin layer. In the present embodiments, the cavity around the second fin layer is formed by removing the sacrificial layer in step 168 (by forming top and side portion of the cavity) and removing the un-oxidized portion of the first fin layer in step 170 (by forming the bottom portion of the cavity), therefore dimensions of the bottom portion of the cavity are adjustable by controlling the oxidation process in step 164 to match the top and side portions of the cavity. Step 170 includes using an etching process. With reference to the examples of FIGS. 20A and 20B, the cavity 264 is completely formed around the second fin layer 208 by removing the un-oxidized portion of the first fin layer 206. The third fin layer 262 is disposed over the first fin layer 206, and the second fin layer 208 serves as a channel (or a bridge channel) connecting the third fin layer 262.

The method 160 proceeds to step 172 by forming a gate stack around the second fin layer (channel) to form a GAA device or transistor by filling the cavity around the second fin layer. In some embodiments, the gate stack includes an ILD layer, a high-k dielectric layer and a gate layer. The ILD layer includes silicon oxide, silicon nitride, or silicon nitride-oxide. The high-k dielectric layer includes a material or compound having a high dielectric constant. The gate layer includes a polysilicon, or a metal. In the present embodiments, a top portion and a bottom portion of the gate stack around the second fin layer (channel) is formed at the same time, and therefore a GAA gate is also referred to as a self-aligned gate. In some embodiments, dimension of top portion and bottom portion of the GAA gate is controlled by dimension of the cavity underneath the channel.

Step 172 includes using a deposition process, such as a CVD, a PECVD, an ALD, or an electro-plating process. Step 172 also includes using an etching process. Step 172 also includes using a cleaning process. With reference to the examples of FIGS. 21A and 21B, a gate stack 266 is disposed around the second fin layer 208 and between lateral spacers 218. It is understood that additional steps can be provided before, during, and after the method 160, and some the steps described can be replaced, eliminated, or moved around for additional embodiments of the method 160.

Figure 22:
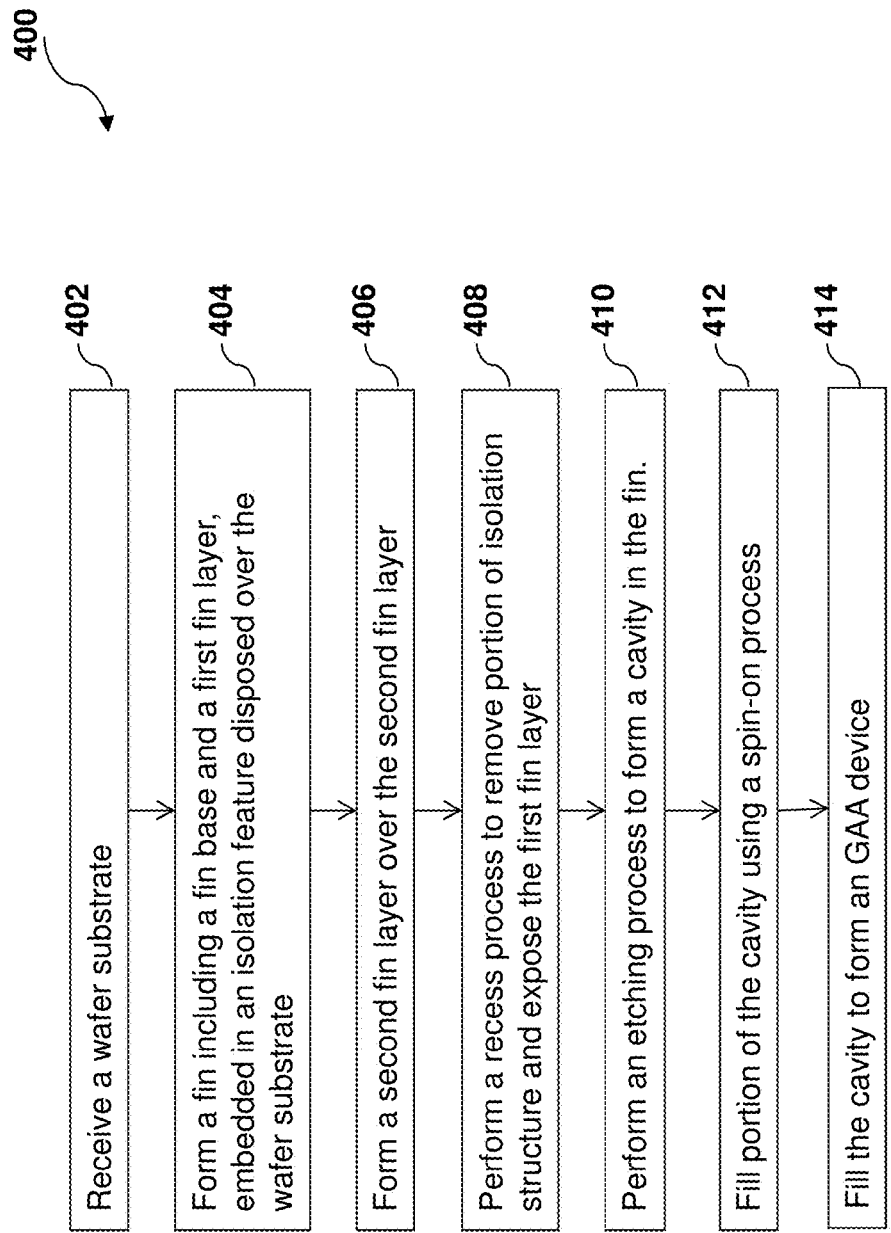

Referring to FIG. 22, a flow chart of a method 400 of fabricating a device is illustrated according to one or more embodiments. FIGS. 23A-30B, are diagrams or cross sectional views of fabricating a device 500 using the method 400 for implementing one or more embodiments.

The method 400 begins at step 402 by receiving a wafer substrate. In some embodiments, the wafer substrate includes a wafer and/or a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), and platinum (Pt) and, thereof an alloy of the metals and other conductive substances such as nitrides (e.g. titanium nitride (TiN), tantalum nitride (TaN) and carbides (e.g. titanium carbide (TiC), tantalum carbide (TaC). The insulator material may include silicon oxide and silicon nitride.

The method 400 proceeds to step 404 by forming a fin embedded in an isolation feature, such as a STI feature. In some embodiments, the fin includes a fin base disposed over the wafer substrate and embedded in the isolation feature disposed over the wafer substrate, and a first fin layer disposed over the fin base. In one embodiment, the fin base includes portion of the wafer substrate. In another embodiment, the first fin layer includes an EPI layer, such as a SiGe layer. The isolation feature includes silicon oxide, silicon nitride, or a silicon nitride-oxide.

Step 404 includes using a depositing or growing process, for example, to form the first fin layer over the wafer substrate or an isolation layer over the fin and the wafer substrate for the isolation feature. Step 404 also includes using a lithography process. Step 404 includes using an etching process. Step 404 further includes using a chemical mechanical polishing process. With reference to the examples of FIGS. 23A and 23B, a fin 504 is disposed over a wafer substrate 502 and embedded in an isolation feature 506 disposed over the wafer substrate 502, and the fin 504 includes a fin base 508 disposed on the wafer substrate 502 and a first fin layer 510 disposed over the fin base 508.

The method 400 proceeds to step 406 by forming a second fin layer over the first fin layer. In some embodiments, the second fin layer will serve as a source/drain of the device 500. In one embodiment, the second fin layer may include an EPI layer, such Si EPI layer. The second fin layer has a substantial different etching rate compared to the first fin layer underneath the second fin layer. Step 406 includes using a deposition or a growth process. Step 406 may include a CMP process. Step 406 may also include using an etching process. Step 406 further includes using a cleaning process. With reference to the examples of FIGS. 24A and 24B, a second layer 512 with a top is disposed over the second fin layer 510 and the isolation structure 506; with reference to the examples of FIGS. 25A and 25B, the top of the second layer 512 is removed by a CMP process; and with reference to the examples of FIGS. 26A and 26B, the patterned second fin layer 512 is formed over the first fin layer 510 after an etching process.

The method 400 proceeds to step 408 by removing a portion of the isolation feature to expose the first fin layer buried into the isolation feature. Step 408 includes using a recess etch process. Step 408 also includes using a cleaning process. With reference to the examples of FIGS. 27A and 27B, a portion of the isolation feature 506 is removed and the first fin layer 510 between the fin base 508 and the second fin layer 512 is exposed.

The method 400 proceeds to step 410 by performing an etching process to remove the first fin layer between the fin base and the second fin layer and create a cavity between the fin base and the second fin layer by taking advantage of a significantly different etching rate of the first fin layer compared to the fin base or the second fin layer. Step 410 includes using an etching process and a cleaning process. With reference to the examples of FIGS. 28A and 28B, the first fin layer 510 is removed and a cavity 514 between the fin base 508 and the second fin layer 512.

The method 400 proceeds to step 412 by filling a portion of the cavity with a filling material, for example by a spin-on process. The filling material may include a dielectric material, or a non-conductive material. In one embodiment, the filling material includes the same material used as the isolation feature, such as silicon oxide. In some embodiments, an oxidation step can be performed to partially fill the cavity with oxide. In some embodiments, step 412 is an optional step and may be skipped. With the reference to the examples of FIGS. 29A and 29B, the cavity 514 is partially filled with the same material included in the isolation feature 506.

The method 400 proceeds to step 414 by filling up the cavity with a gate stack around the second fin layer to form a GAA transistor. In the present embodiments, the gate stack includes an ILD layer, a high-k dielectric layer and a gate layer. In some embodiments, the ILD layer includes silicon oxide, silicon nitride, or silicon nitride-oxide, the high-k dielectric layer includes a material or compound having a high dielectric constant, and the gate layer includes a polysilicon or a metal. In the present embodiments, a top portion and a bottom portion of the gate stack around the second fin layer (channel) is formed at the same time, and therefore the gate stack around the second fin layer is also referred to as a self-aligned gate. In some embodiments, dimension of top portion and bottom portion of the GAA gate is controlled by dimension of the cavity around the second fin layer (channel).

Step 414 includes using deposition, lithography and etching processes. Additional steps can be provided before, during, and after the method 400, and some the steps described can be replaced, eliminated, or moved around for additional embodiments of the method 400. The method 400 is example embodiments, and is not intended to limit the present invention beyond what is explicitly recited in the claims. With the reference to the examples of FIGS. 30A and 30B, a gate stack 516 is disposed around the second fin layer 512 by filling up the cavity 514.

According to some embodiments, a single channel GAA transistor or a multiple channel GAA transistor as shown in FIGS. 15A and 15B, 21A and 21B, and 30A and 30B, improves a saturation sub-threshold slope (Ssat) and drain induced barrier lowering (DIBL) of a transistor, such as a fin field effect transistor (FinFET), and therefore improves Ion/Ioff ratio in the transistor. Lowing the Ion/Ioff is essential to lowering supply voltage and hence, power consumption.

Figures 31A, 31B, 31C:
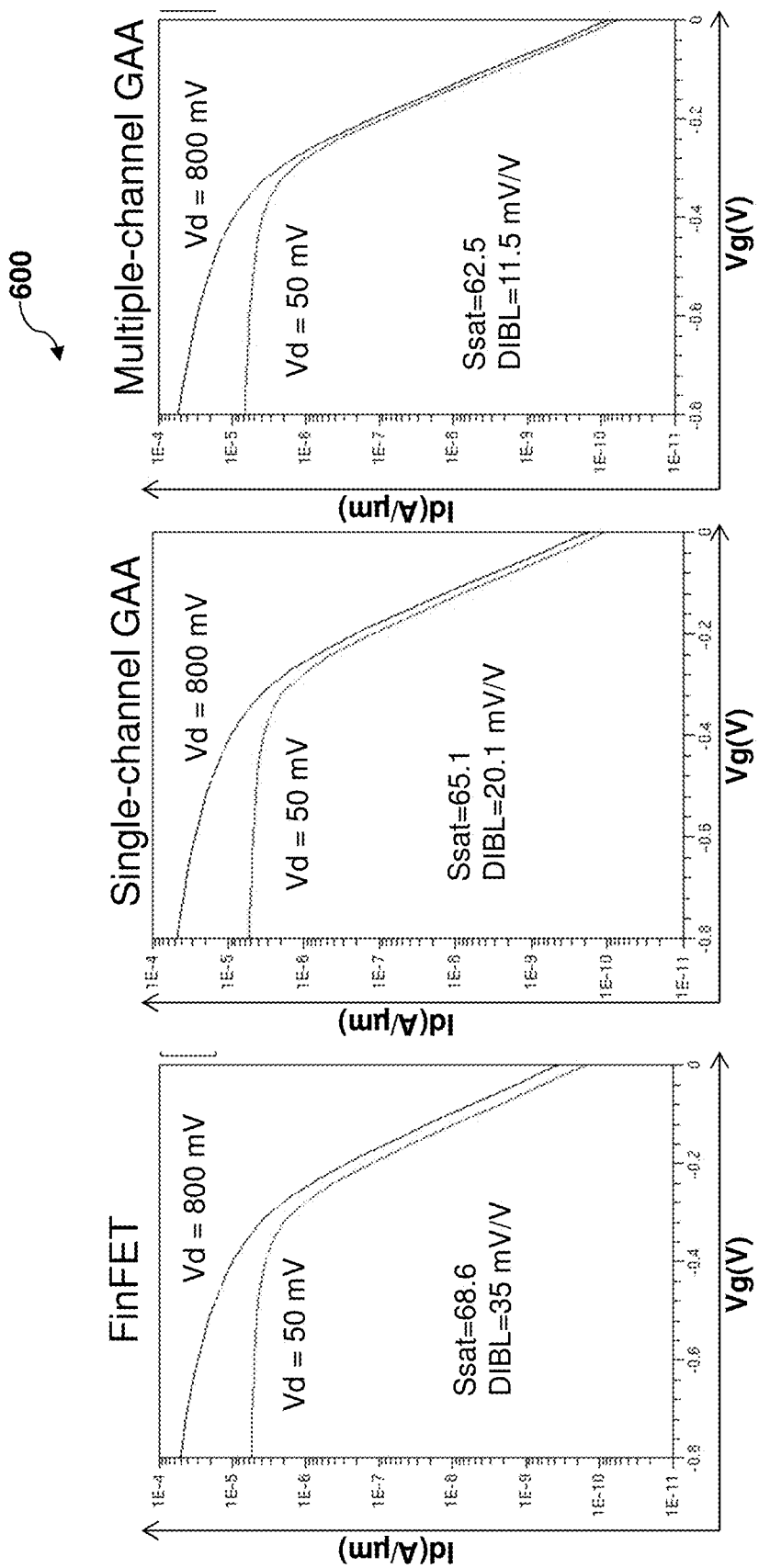
FIGS. 31A-C and 32A-C are graphs of electric parameters of three exemplary devices according to one or more embodiments of the present disclosure.

FIGS. 31A-C are examples of electrical parameters 600 from a PMOS transistor of a FinFET, a single channel GAA FET, and a multiple channel GAA FET according to one or more embodiments. FIG. 31A represents a gate voltage (Vg) vs. drain current (Id) when a drain voltage (Vd=50 mV or Vd=800 mV) is applied on a FinFET, FIG. 31B represents the Vg vs. Id when the Vd is 50 mV or 800 mV on a single channel GAA FET, and FIG. 31C represents the Vg vs. Id when the Vd is 50 mV or 800 mV on a multiple channel GAA FET respectively. In one embodiment, the subthreshold slope in saturation (Ssat) is improved (lowered) in a GAA FET. For example, the Ssat is 68.6 at a PMOS transistor of a FinFET, 65.1 at a PMOS transistor of a single channel GAA FET, and 62.5 at a PMOS transistor of a multiple channel GAA FET. In another embodiment, the drain-induced barrier lowering (DIBL) is also improved (lowered) in a GAA FET. For example, the DIBL is 35 mV/V at a PMOS transistor of a FinFET, 20.1 mV/V at a PMOS transistor of a single channel GAA FET, and 11.5 mV/V at a PMOS transistor of a multiple channel GAA FET.

Figures 32A, 32B, 32C:
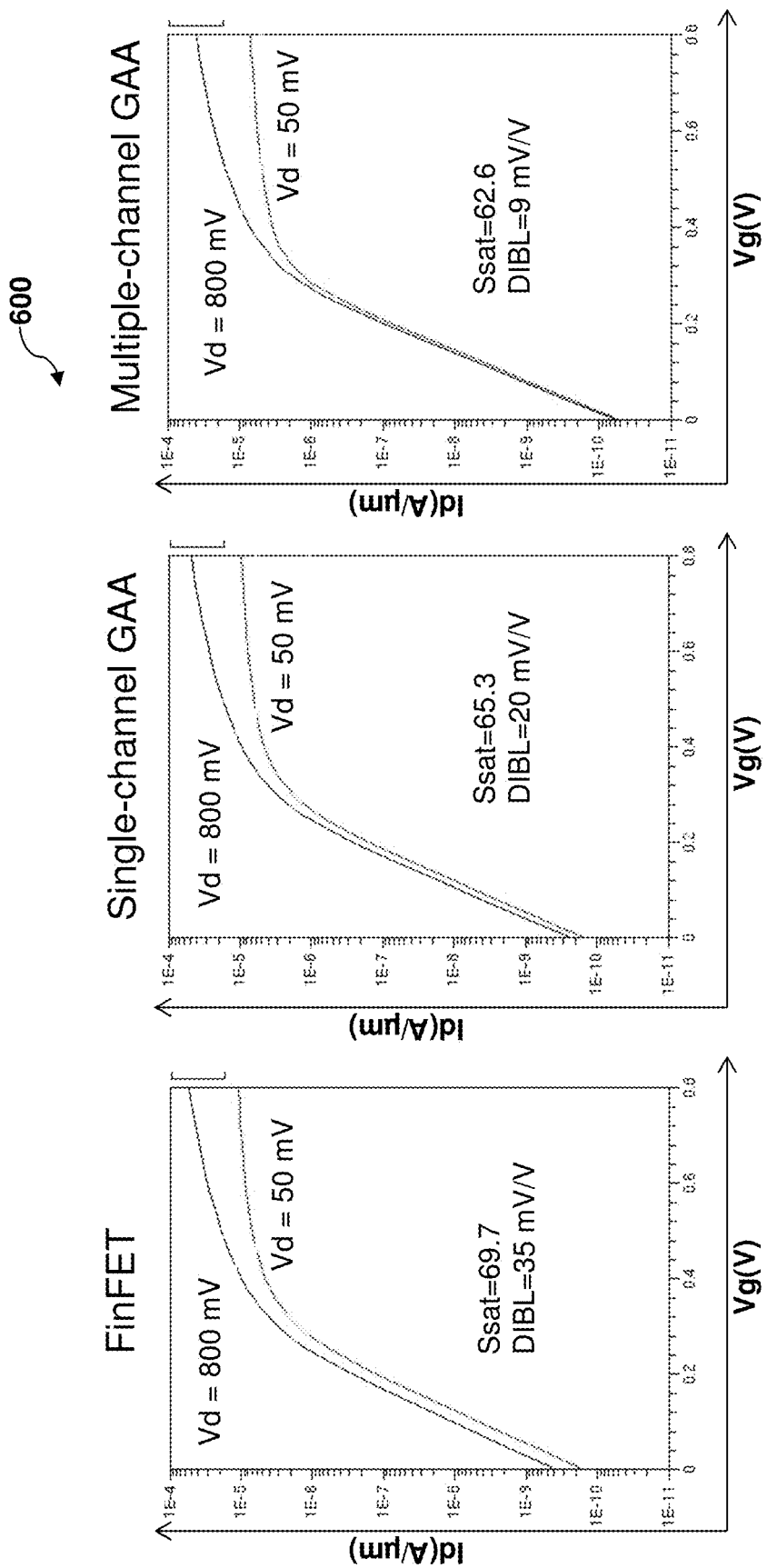

FIGS. 32A-C are examples of electrical parameters 650 from a NMOS transistor of a FinFET, a single channel GAA FET, and a multiple channel GAA FET according to one or more embodiments. FIG. 32A represents the Vg vs. drain current (Id) when the Vd is 50 mV or 800 mV applied on a FinFET, FIG. 32B represents the Vg vs. Id when the Vd is 50 mV or 800 mV applied on a single channel GAA FET, and FIG. 32C represents the Vg vs. Id when the Vd is 50 mV or 800 mV applied on a multiple channel GAA FET respectively. In one embodiment, the Ssat is improved (lowered) in a GAA FET. For example, the Ssat is 69.7 at a NMOS transistor of a FinFET, 65.3 at a NMOS transistor of a single channel GAA FET, and 62.6 at a PMOS transistor of a multiple channel GAA FET. In another embodiment, the DIBL is also improved (lowered) in a GAA FET. For example, the DIBL is 35 mV/V at a NMOS transistor of a FinFET, 20 mV/V at a NMOS transistor of a single channel GAA FET, and 9 mV/V at a NMOS transistor of a multiple channel GAA FET.

In the foregoing discussion, by fabricating a device, various processes, such us a film deposition process, a lithography process, an etching process, an ion implantation process, a CMP process, and a cleaning process, are performed. In some embodiments, the film deposition process includes depositing a plasma-enhanced chemical vapor deposition (PECVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film on a wafer substrate, exposing the resist film deposited on the wafer substrate by an optical lithography tool or an electron beam writer, and developing the exposed resist film to form a resist pattern for an ion implantation process or an etching process. The coating the resist film on the wafer substrate includes performing a dehydration process before applying the resist film on the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. The coating the resist film on the wafer substrate may include a soft bake (SB). The exposing the resist film deposited on the wafer substrate includes using a mask. The mask may be a binary mask (BIM), a super binary mask (SBIM), or a phase shift mask (PSM), which includes an alternative phase shift mask (alt. PSM) or an attenuated phase shift mask (att. PSM). The optical lithography tool may include an I-line, a deep ultraviolet (DUV), or an extreme ultraviolet (EUV) tool. The developing the exposed resist film may include a post exposure bake (PEB), a post develop bake (PDB) process, or a combination thereof.

In some embodiments, the etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Thus, the present disclosure describes a device. The device includes a wafer substrate including an isolation feature, a fin base embedded in the isolation feature, at least one channel disposed above the fin base, and a gate stack disposed around the channel, wherein the gate stack includes a top portion and a bottom portion of the gate stack formed by filling a cavity around the channel such that the top portion and bottom portion are aligned each other. The device further includes at least one source and one drain disposed over the fin base, wherein the channel connects the source and the drain. The device further includes the source and the drain disposed over a fin insulator disposed over the fin base. The fin insulator includes an oxide compound. The channel includes a first channel and second channel. The first channel is self-aligned to the second channel. The channel includes an epitaxial (EPI) layer. The gate stack includes an interfacial layer, a high-k dielectric layer and a gate layer. The gate layer includes polysilicon, or a metal.

In some embodiments, a method of fabricating a device is described. The device includes forming a fin, including a fin base and at least one pair of first fin layer and second fin layer alternatively disposed on the fin base wherein the second fin layer has a significantly different etching rate compared to the second fin layer in a wafer substrate, forming an isolation feature over the wafer substrate and around the fin, forming a dummy gate stack over the fin; wherein forming the dummy gate stack includes forming a bottom sacrificial layer, a middle sacrificial layer over the bottom sacrificial layer and a top sacrificial layer over the middle sacrificial layer, depositing a spacer along sidewall of the dummy gate stack, removing the top sacrificial layer, the middle sacrificial layer and the bottom sacrificial layer, removing the first fin layer to form a cavity around the second fin layer, and depositing a gate stack into the cavity around the second fin layer to form a gate all around the second fin layer. The method further includes growing a source and drain attached to the second fin layer. Growing the source and the drain includes growing an epitaxial (EPI) layer over the fin base and further over the first fin layer. The method further includes oxidizing the first fin layer. Removing the first fin layer includes using an etching process. Depositing the gate stack includes depositing an interfacial layer, a high-k dielectric layer and a gate layer In other embodiments, a method of fabricating a device is presented. The method includes forming a fin embedded in an isolation layer deposited on a wafer substrate, wherein forming the fin includes forming a fin base and a first fin layer deposited over the fin base, forming a second fin layer over the first fin layer, wherein the first fin layer has a significant different etching rate compared to the second fin layer, performing a recess process to remove portion of the isolation layer and expose the first fin layer, removing the first fin layer to form a cavity underneath the second fin layer, and depositing a gate stack into the cavity around the second fin layer to form a gate all around (GAA) the second fin layer, wherein depositing the gate stack includes depositing an interfacial layer, a high-k dielectric layer and a gate layer. The method further includes using a spin-on process to partially fill the cavity. Forming the second fin layer includes using an epitaxial (EPI) layer. Removing the first fin layer includes using an etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a wafer substrate including an isolation feature having a top surface parallel to a top surface of the wafer substrate;
   a fin base embedded in the isolation feature, wherein a portion of the fin base physically contacts the isolation feature;
   at least one channel disposed above the fin base, wherein the at least one channel is disposed over the top surface of the isolation feature; and
   a gate stack disposed around the at least one channel, wherein the gate stack includes a top portion disposed on the at least one channel and a bottom portion disposed within a cavity underneath the at least one channel such that the top portion and the bottom portion are aligned with each other.

2. The device of claim 1, further comprising at least one source and one drain disposed over the fin base, wherein the at least one channel connects the source and the drain.

3. The device of claim 2, further comprising the source and the drain disposed over a fin insulator disposed over the fin base.

4. The device of claim 3, wherein the fin insulator includes an oxide compound.

5. The device of claim 1, wherein the at least one channel includes a first channel and second channel.

6. The device of claim 5, wherein the first channel is self-aligned to the second channel.

7. The device of claim 1, wherein the at least one channel includes an epitaxial (EPI) layer.

8. The device of claim 1, wherein the gate stack includes an interfacial layer, a high-k dielectric layer, and a gate layer.

9. The device of claim 8, wherein the gate layer includes metal.

10. A device comprising:
    an isolation feature disposed on a semiconductor substrate, wherein the isolation feature has a top surface parallel to a top surface of the semiconductor substrate;
    a first fin structure embedded in the isolation feature;
    a second fin structure disposed over the first fin structure;
    a gate stack including a first portion and a second portion, wherein the first portion is disposed over the first fin structure and below the second fin structure and the second portion is disposed over the first and second fin structures, wherein the gate stack does not extend below the top surface of the isolation feature; and
    a source/drain feature disposed directly above the first fin structure.

11. The device of claim 10, wherein the gate stack wraps around the second fin structure.

12. The device of claim 10, wherein the second fin structure is a channel of the gate stack.

13. The device of claim 10, wherein the source/drain feature is connected to the second fin structure.

14. The device of claim 10, further comprising an oxide layer, wherein the source/drain feature is disposed over the oxide layer.

15. The device of claim 10, further comprising a third fin structure disposed over the second fin structure, and
    wherein the second portion extends from the second fin structure to the third fin structure.

16. The device of claim 15, wherein the gate stack includes a third portion disposed over the third fin structure.

17. The device of claim 15, wherein the second fin structure is another channel of the gate stack.

18. The device of claim 10, wherein the gate stack physically contacts the first, second, and third fin structures.

19. The device of claim 10, wherein the isolation feature is a shallow trench isolation structure.

20. The device of claim 10, wherein the gate stack includes a metal layer.

* * * * *